United States Patent
Levy et al.

(10) Patent No.: US 6,507,496 B2
(45) Date of Patent: Jan. 14, 2003

(54) MODULE HAVING INTEGRATED CIRCUIT PACKAGES COUPLED TO MULTIPLE SIDES WITH PACKAGE TYPES SELECTED BASED ON INDUCTANCE OF LEADS TO COUPLE THE MODULE TO ANOTHER COMPONENT

(75) Inventors: Paul S. Levy, Chandler, AZ (US); David Frame, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/872,122

(22) Filed: May 31, 2001

(65) Prior Publication Data

US 2002/0181214 A1 Dec. 5, 2002

(51) Int. Cl.$^7$ .............................. H05K 7/06; H05K 7/08; H05K 7/10
(52) U.S. Cl. ................ 361/760; 361/764; 361/773; 361/715; 257/427; 257/531; 336/200
(58) Field of Search ................... 361/760, 764, 361/773, 774, 791, 803, 715; 257/531, 414, 427; 336/200

(56) References Cited

U.S. PATENT DOCUMENTS

| | | | | |
|---|---|---|---|---|
| 5,103,247 A | * | 4/1992 | Sugano et al. ............... 361/785 |
| 5,703,760 A | * | 12/1997 | Zhu ............................ 361/785 |
| 5,973,567 A | * | 10/1999 | Heal et al. ................... 330/277 |
| 5,982,633 A | * | 11/1999 | Jeansonne ................... 361/766 |
| 6,058,444 A | * | 5/2000 | Johnson ....................... 326/30 |
| 6,251,695 B1 | * | 6/2001 | Kwon .......................... 438/14 |
| 6,301,121 B1 | * | 10/2001 | Lin ............................. 361/783 |
| 6,330,164 B1 | * | 12/2001 | Khandros et al. ........... 361/760 |

* cited by examiner

Primary Examiner—David Martin
Assistant Examiner—Hung Bui
(74) Attorney, Agent, or Firm—Blakely, Sokoloff, Taylor & Zafman LLP

(57) ABSTRACT

A dual-sided circuit board module designed for an operating position that is not perpendicular to a system motherboard will be coupled to the motherboard by leads having at least two different lengths. Because leads of differing lengths have differing associated inductance, the operating characteristics of the leads and therefore the devices coupled to the leads will differ. In order to improve the operating characteristics of the module, integrated circuit packages are selected based on the inductive (and possibly other) qualities of the leads to which the respective packages are coupled. In one embodiment, leads having a larger inductance are coupled to integrated circuit (IC) packages having a smaller inductance and vice versa, which allows the inductive characteristics of the various components of the module to have more closely matching inductive characteristics than would otherwise be possible.

28 Claims, 3 Drawing Sheets

US 6,507,496 B2

MODULE HAVING INTEGRATED CIRCUIT PACKAGES COUPLED TO MULTIPLE SIDES WITH PACKAGE TYPES SELECTED BASED ON INDUCTANCE OF LEADS TO COUPLE THE MODULE TO ANOTHER COMPONENT

FIELD OF THE INVENTION

The invention relates to circuit board modules having multiple integrated circuit packages. More specifically, the invention relates to the inductive properties of circuit board modules coupled with leads of differing lengths.

BACKGROUND OF THE INVENTION

Memory modules within computer or other electronic systems often consist of a printed circuit board (PCB) with integrated circuit (IC) packages containing the memory circuits attached to the PCB. These memory modules can take various forms known in the art, for example, single in-line memory modules (SIMMs), dual in-line memory modules (DIMMs), and other forms. The modules are coupled to a motherboard having system components such as one or more processors, buses, I/O devices, etc., by an interface that has multiple leads to make an electrical contact with the memory module.

The leads of the memory module interface have associated electrical properties including inductance, which is proportional to a resistance to current flow provided by the leads. Inductance causes a current lag in which current flow lags the corresponding voltage change. For example, when a voltage level changes on a memory module interface lead, the inductance of the lead affects the timing with which the corresponding current changes. Because current is required to change the states of the transistors within the memory module ICs, inductance can affect the operation of the memory module.

As clock frequencies within electronic systems increase, the voltage changes used to communicate the clock frequencies become closer together in time and the impedance of the leads can become a factor in operational frequency. Specifically, a sufficiently high operating frequencies, the inductance of a module and associated leads can become a limiting factor in the speed at which the module can operate.

BRIEF DESCRIPTION OF THE DRAWINGS

The invention is illustrated by way of example, and not by way of limitation, in the figures of the accompanying drawings in which like reference numerals refer to similar elements.

DETAILED DESCRIPTION

A circuit board module having multiple integrated circuit (IC) package types is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

A dual-sided circuit board module designed for an operating position that is not perpendicular to a system motherboard will be coupled to the motherboard by leads having at least two different lengths. Because leads of differing lengths have differing associated inductance, the operating characteristics of the leads and therefore the devices coupled to the leads will differ. In order to improve the operating characteristics of the module, integrated circuit packages are selected based on the inductive (an possibly other) qualities of the leads to which the respective packages are coupled. In one embodiment, leads having a larger inductance are coupled to IC packages having a smaller inductance and vice versa, which allows the inductive characteristics of the various components of the module to have more closely matching inductive characteristics than would otherwise be possible.

Figure 1:
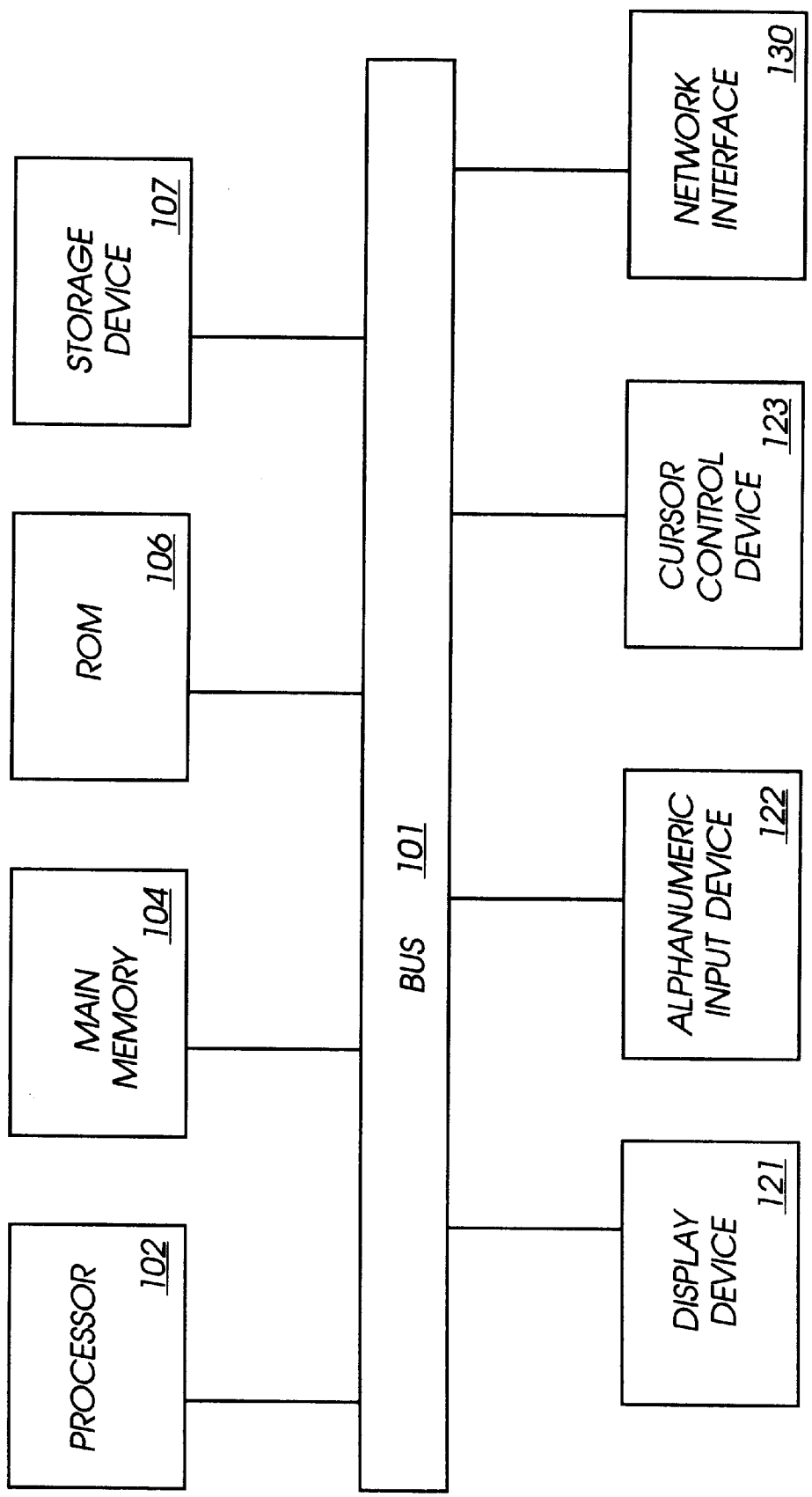
FIG. 1 is a block diagram of one embodiment of a computer system.

FIG. 1 is a block diagram of one embodiment of a computer system. The computer system illustrated in FIG. 1 is intended to represent a range of computer systems, for example, a laptop computer system, a low-profile server system or any other electronic system having memory modules. Alternative computer systems can include more, fewer and/or different components.

Computer system 100 includes bus 101 or other communication device to communicate information, and processor 102 coupled to bus 101 to process information. While computer system 100 is illustrated with a single processor, computer system 100 can include multiple processors and/or co-processors. Computer system 100 further includes random access memory (RAM) or other dynamic storage device 104 (referred to as main memory), coupled to bus 101 to store information and instructions to be executed by processor 102. Main memory 104 also can be used to store temporary variables or other intermediate information during execution of instructions by processor 102.

Computer system 100 also includes read only memory (ROM) and/or other static storage device 106 coupled to bus 101 to store static information and instructions for processor 102. Data storage device 107 is coupled to bus 101 to store information and instructions. Data storage device 107 such as a magnetic disk or optical disc and corresponding drive can be coupled to computer system 100.

Main memory 104, ROM 106, or any other memory module can consist of multiple modules coupled to a system motherboard (not shown in FIG. 1) by a set of leads. The memory modules can be at an angle other then 90° with respect to the motherboard such that the leads coupled to one side of the module are shorter than leads coupled to another side of the module. In such a configuration, the inductance of the longer leads is higher than the inductance of the shorter leads.

While inductance and module design are described with respect to memory modules, the same designs and techniques can be applied to other types of devices. For example, one or more processors of a computer system can be mounted to a printed circuit board (PCB) or other material that is coupled to another board by a set of leads. The processor module can be designed as described herein with respect to memory modules.

Computer system 100 can also be coupled via bus 101 to display device 121, such as a cathode ray tube (CRT) or liquid crystal display (LCD), to display information to a computer user. Alphanumeric input device 122, including alphanumeric and other keys, is typically coupled to bus 101 to communicate information and command selections to processor 102. Another type of user input device is cursor control 123, such as a mouse, a trackball, or cursor direction keys to communicate direction information and command selections to processor 102 and to control cursor movement on display 121. Computer system 100 further includes network interface 130 to provide access to a network, such as a local area network.

Figure 2:
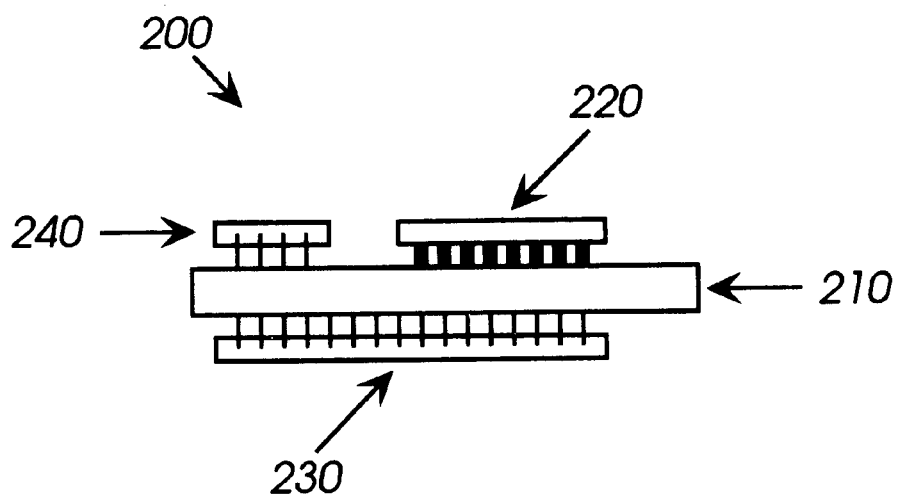
FIG. 2 illustrates one embodiment of a module having integrated circuit packages coupled to multiple sides.

FIG. 2 illustrates one embodiment of a module having integrated circuit packages coupled to multiple sides. Module 200 includes printed circuit board (PCB) 210, integrated circuit package 220, integrated circuit package 230 and serial presence detect chip 240. Other IC components can also be coupled to PCB 210.

In one embodiment, IC package 220 is a field ball grid array (FBGA) package and IC package 230 is a thin small outline package (TSOP) IC package that has less inductance than FBGA IC package 220. Any type of IC package can be used to more closely match inductance between sides of a module when the module is coupled to a motherboard by one or more sets of leads. By using different package types, inductance matching is easier to accomplish than by more traditional serpentine routing techniques that can degrade signal quality.

Serial presence detect chip 240 is an optional component for module 200. Serial presence detect chip 240 can indicate to an operating system (OS) or basic input/output system (BIOS) the configuration of module 200 for configuration or other purposes. In one embodiment, serial presence detect chip 240 is coupled to the motherboard by an Inter-IC (I²C) interface; however, other types of interfaces can also be used.

IC packages are described as FBGA and TSOP packages. However, any type of IC package can be used for a module. These IC packages include, but are not limited to, Dual In-line Package (DIP), Shrink DIP (SDIP), Pin Grid Array (PGA), Interstitial PGA (IPGA), Small Outline Package (SOP), Small Outline J-lead (SOJ) package, Leadless Chip Carrier (LCC), J-Leaded Chip Carrier (JLCC), Quad Flat Pack (QFP), Metal QFP (MQFP), Thin QFP (TQFP), Very small QFP (VQFP), Ball Grid Array (BGA), Interstitial BGA (IBGA), Micro BGA (MBGA).

Figure 3:
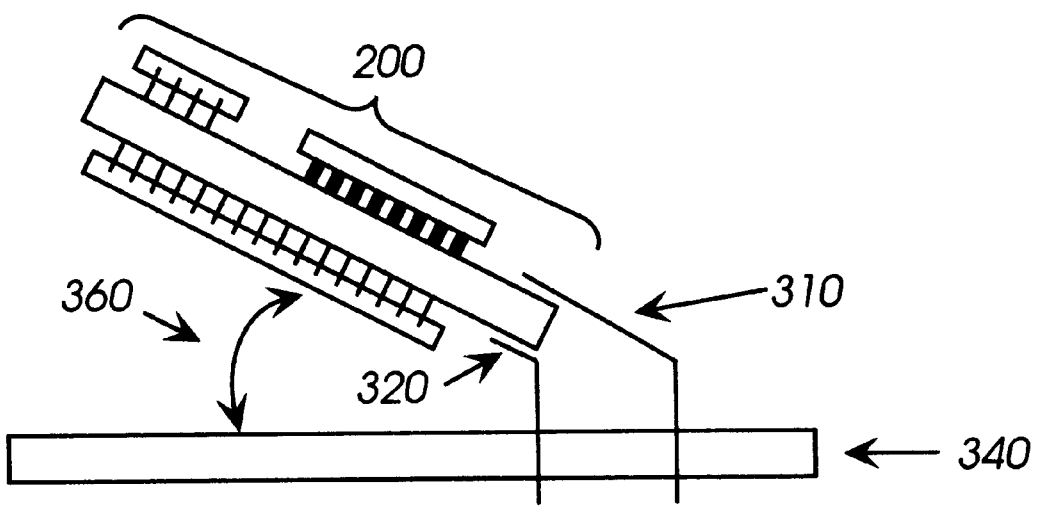
FIG. 3 illustrates one embodiment of a module having integrated circuit packages coupled to multiple sides that is coupled to another component by leads having differing lengths.

FIG. 3 illustrates one embodiment of a module having integrated circuit packages coupled to multiple sides that is coupled to another component by leads having differing lengths. Module 200 is coupled to another component such as motherboard 340 by multiple leads. With respect to FIG. 3 a "set" of leads refers to one or more leads having substantially similar length. For example, FIG. 3 illustrates two sets of leads (310 and 320) one of which includes leads that are longer than the other set. Although depicted as disparate elements, those skilled in the art will appreciate that leads 310 and 320 may well be embodied within a connector. According to one example implementation, leads 310 and 320 are embodied within a single, fabricated surface mount connector. Those skilled in the art will appreciate that any of a number of connectors which implement the teachings of the present invention may well be used.

Module 200 is coupled to motherboard 340 at a predetermined angle 360. For example, in a 1U server, which is 1.75" tall, the predetermined angle 360 is approximately 25°. For other applications, predetermined angle 360 may be a different angle.

If predetermined angle 360 is any angle other than 90°, the length of the leads in the sets of leads (e.g., 310 and 320) that couple module 200 to motherboard 340 will be different. In general, the more the angle 360 differs from 90°, the greater the difference in length between the sets of leads and the greater the difference in lead length the greater the difference in inductance values between the sets of leads.

In one embodiment, the set of leads that couple packages on one side of the module board to the motherboard are approximately equal in length and the set of leads that couple packages on the other side of the module board to the motherboard are approximately equal in length, but a different length than other set of leads. Other lead configurations can also be supported, for example, the average inductance for a set of leads having differing lengths can be used as the inductance value for the set of leads.

In the example of FIG. 3, leads 310 are longer than leads 320 and therefore the inductance of leads 310 is greater than the inductance of leads 320. Because the inductance of leads 320 is greater than the inductance of leads 310, the IC package coupled with leads 320 has a lower inductance than the IC package that is coupled the IC package coupled with leads 310. In one embodiment, the IC package coupled with leads 310 is a FBGA package and the IC package coupled with leads 320 is a TSOP package. In alternate embodiments, other IC package combinations can also be used.

In addition to providing a measure of inductance matching, the use of different types of IC packages can provide other benefits. For example, the combination of FBGA and TSOP packages described above can be manufactured at a lower cost than a module with FBGA packages on both sides of the board. Routing benefits can also be achieved through use of different types of IC packages by eliminating routing for inductance matching purposes.

Figure 4:
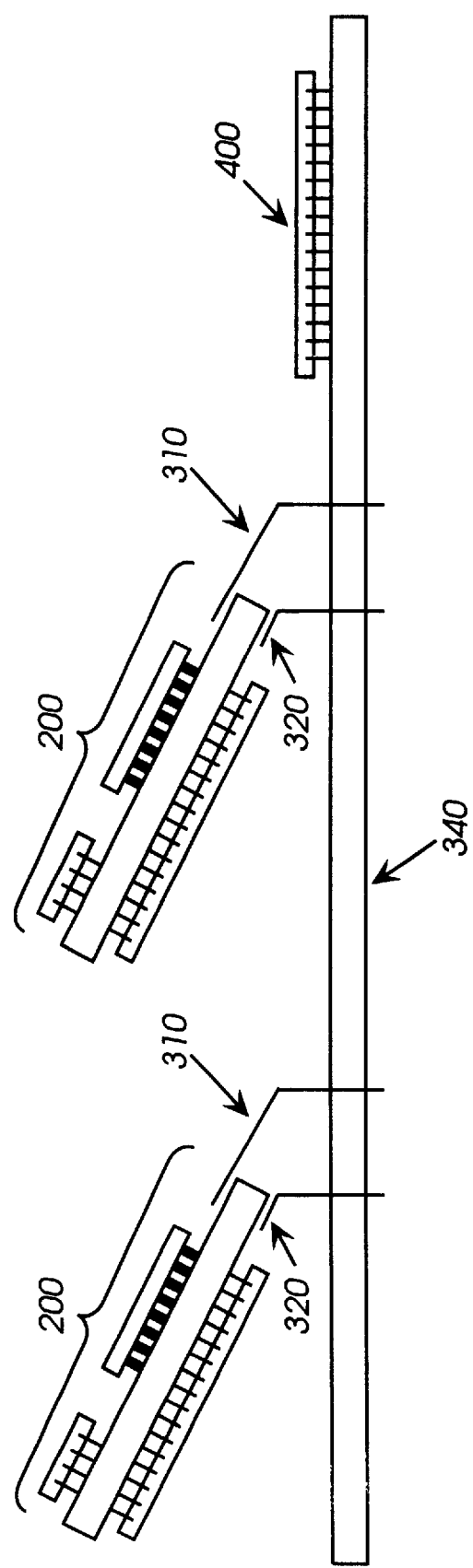
FIG. 4 illustrates one embodiment of an electronic system with multiple modules having integrated circuit packages coupled to multiple sides that are coupled to a motherboard by leads having differing lengths.

FIG. 4 illustrates one embodiment of an electronic system with multiple modules having integrated circuit packages coupled to multiple sides that are coupled to a motherboard by leads having differing lengths. The example of FIG. 4 illustrates two modules (e.g., memory modules) coupled to a motherboard having a single processor; however, any number and/or type of modules as well as any number and/or type of other devices can be coupled to motherboard 340.

Processor 400 is coupled to motherboard 340 in any manner known in the art. Processor 400 is illustrated as a TSOP package; however, any type of package can be used. Processor 400 is coupled to leads 310 and 320 by a bus or other device (not shown in FIG. 4). Signals are routed between the bus to modules 2 by leads 310 and 320.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A module comprising:
 a board to be coupled to a first set of leads having a first inductance and a second set of leads having a second inductance, wherein the first set of leads are longer than the second set of leads;
 a first integrated circuit package of a first type having a third inductance coupled to a first side of the board; and
 a second integrated circuit package of a second type having a fourth inductance coupled to a second side of the board.

2. The module of claim 1 wherein the board comprises a printed circuit board (PCB).

3. The module of claim 1 wherein the first inductance and the third inductance are substantially matched and the second inductance and the fourth inductance are substantially matched.

4. The module of claim 1 wherein the first integrated circuit package comprises a Field Ball Grid Array (FBGA) package.

5. The module of claim 4 herein the second integrated circuit package comprises a Thin Small Outline Package (TSOP) package.

6. The module of claim 1 wherein the first set of leads and the second set of leads couple the board to a second board and further wherein an angle between the board and the second board is less than 90°.

7. The module of claim 6, wherein the first set of leads and the second set of leads are integrated within a connector, to couple the board to the second board at an angle less than 90°.

8. The module of claim 1 further comprising a Presence Detect (PD) component to identify the module as having the first integrated circuit package having the third inductance coupled to the first side of the board and the second integrated circuit package having the fourth inductance coupled to the second side of the board.

9. The module of claim 1 wherein the first integrated circuit package includes one or more memory circuits.

10. The module of claim 9 wherein the second integrated circuit package includes one or more memory circuits.

11. The module of claim 1 wherein the first integrated circuit package includes one or more processors.

12. The module of claim 1 wherein the first integrated circuit package is of a first type and the second integrated circuit package is of a second type.

13. A memory system comprising:
 a first board to be coupled to a first set of leads having a first inductance and a second set of leads having a second inductance, wherein the first set of leads are longer than the second set of leads, the first set of leads and the second set of leads to couple the first board to a second board;
 a first set of integrated circuit packages of a first type each having a third inductance and each coupled to a first side of the first board; and
 a second set of integrated circuit packages of a second type each having a fourth inductance and each coupled to a second side of the first board.

14. The memory system of claim 13 wherein the first inductance and the third inductance are substantially matched and the second inductance and the fourth inductance are substantially matched.

15. The memory system of claim 13, wherein the first set of leads and the second set of leads are integrated within a single connector.

16. The memory system of claim 13 wherein the first integrated circuit package comprises a Field Ball Grid Array (FBGA) package.

17. The memory system of claim 16 wherein the second integrated circuit package comprises a Thin Small Outline Package (TSOP) package.

18. The memory system of claim 16 wherein an angle between the first board and the second board is less than 90°.

19. The memory system of claim 13 further comprising a Presence Detect (PD) component to identify the module as having the first integrated circuit package having the third inductance coupled to the first side of the board and the second integrated circuit package having the fourth inductance coupled to the second side of the board.

20. The memory system of claim 14 wherein the first integrated circuit package is of a first type and the second integrated circuit package is of a second type.

21. An electronic device comprising:
 a bus;
 a first board with components coupled thereto, the first board coupled with the bus;
 a second board to be coupled to the bus via a first set of leads having a first inductance and a second set of leads having a second inductance, wherein the first set of leads are longer than the second set of leads, the first set of leads and the second set of leads to couple the second board to the first board with a predetermined angle;
 a first integrated circuit package of a first type having a third inductance coupled to a first side of the second board; and
 a second integrated circuit package of a second type having a fourth inductance coupled to a second side of the second board.

22. The electronic device of claim 21 wherein the first inductance and the third inductance are substantially matched and the second inductance and the fourth inductance are substantially matched.

23. The electronic device of claim 21 wherein the first integrated circuit package comprises a Field Ball Grid Array (FBGA) package.

24. The electronic device of claim 23 were the second integrated circuit package comprises a Thin Small Outline Package (TSOP) package.

25. The electronic device of claim 21, wherein the first leads and the second leads are fabricated within a connector, and wherein the predetermined angle is less than 90°.

26. The electronic device of claim 21, wherein the second board further comprises a Presence Detect (PD) component to identify the module as having the first integrated circuit package having the third inductance coupled to the first side of the board and the second integrated circuit package having the fourth inductance coupled to the second side of the board.

27. The electronic device of claim 21, further comprising:
 a third board to be coupled to a third set of leads having a fifth inductance and a fourth set of leads having a sixth inductance, the third set of leads and the fourth set of leads to couple the third board to the second board with approximately the predetermined angle;
 a third integrated circuit package having a seventh inductance coupled to a first side of the third board; and
 a fourth integrated circuit package having an eighth inductance coupled to a second side of the third board.

28. The electronic device of claim 23 wherein the first integrated circuit package is of a first type and the second integrated circuit package is of a second type.

* * * * *

UNITED STATES PATENT AND TRADEMARK OFFICE
CERTIFICATE OF CORRECTION

PATENT NO.   : 6,507,496 B2
DATED        : January 14, 2003
INVENTOR(S)  : Levy et al.

It is certified that error appears in the above-identified patent and that said Letters Patent is hereby corrected as shown below:

<u>Column 4,</u>
Line 60, delete "2", insert -- 200 --.

Signed and Sealed this

Twenty-fifth Day of March, 2003

JAMES E. ROGAN
*Director of the United States Patent and Trademark Office*